United States Patent [19]
Chon

[11] Patent Number: 5,193,213
[45] Date of Patent: Mar. 9, 1993

[54] FM BROADCAST BAND SUBCARRIER RECEIVER

[76] Inventor: Hai-jong H. Chon, 245 Bittersweet Rd., Orange, Conn. 06477

[21] Appl. No.: 499,030

[22] Filed: Mar. 26, 1990

[51] Int. Cl.$^5$ .............................. H04B 5/00; H04B 1/16
[52] U.S. Cl. .................................. 455/45; 455/178.1; 455/340; 333/175
[58] Field of Search ............... 455/45, 338, 340, 339, 455/41, 178.1; 333/175, 176, 177; 381/3, 79

[56] References Cited
U.S. PATENT DOCUMENTS 3,883,809  5/1975  Ver Planck et al. ............... 455/339
4,894,629  1/1990  Okamura et al. .................. 333/177

Primary Examiner—Reinhard J. Eisenzopf
Assistant Examiner—Andrew Faile
Attorney, Agent, or Firm—Handal & Morofsky

[57] ABSTRACT

An FM subcarrier receiver of the type useful for detection of a relatively high frequency subcarrier signal transmitted on an FM carrier which includes baseband and relatively high frequency signals is disclosed. It comprises radio frequency circuitry for providing a radio frequency signal having frequency modulated baseband and subcarrier components. High pass filter circuitry receives the output of the radio frequency circuitry. A tuned circuit receives the output of the high pass filter. It comprises a first inductor and a first capacitor tuned substantially to the frequency of the subcarrier which one wishes to detect. A second tuned circuit is tuned to the subcarrier which one wishes to detect. The second tuned circuit comprises a second inductor and a second capacitor. The first and second inductors comprise ferrite cores and are positioned with respect to each other to allow magnetic coupling therebetween. A subcarrier demodulator coupled to the second inductor and the second capacitors provides an audio signal corresponding to the information carried by the subcarrier.

16 Claims, 5 Drawing Sheets

PRIOR ART

FM BROADCAST BAND SUBCARRIER RECEIVER

TECHNICAL FIELD

The present invention relates to electronic circuitry for receiving music or other information endcoded on a subcarrier of an FM broadcast band signal.

BACKGROUND

From its inception, broadcast frequency modulation transmissions, such the type presently occupying the 88–108 Mhz range have been favored for their highly noise resistant characteristics and extended frequency range.

The extended frequency range of these systems is provided due to the fact that the bandwidth allowed an FM broadcast station is extremely wide, as compared, for example, to conventional amplitude modulation (AM) broadcast stations such as those which operate in the various frequency bands below 30 Megahertz. However, the bandwidth of a frequency modulation (FM) transmission is several times that of even an AM station carrying similar frequency content information. While, in theory, it is possible to limit FM modulation to the point where its bandwidth is similar to that of an FM station, such limitation on the modulation index $\beta$ effectively removes the noise resistance of F.M. transmissions.

In particular, let us consider the case of a simple frequency-modulated signal which may be written as:

$$f_c(t) = \cos w_c t \cos (\beta \sin w_m t) - \sin w_c t \sin (\beta \sin w_m t),$$

which $f_c(t)$ is the frequency-modulated carrier, $w_c$ is the carrier frequency of that carrier, $w_n$ is the modulating frequency of a single sinusoidal signal carried by said carrier, t is time and $\beta$ is defined as:

$$\beta = \Delta w / w_n,$$

where $\Delta w$ is the maximum frequency deviation of the FM signal in radians.

Classically, broadcast engineers have tended to think of bandwith in terms of the highest frequency being carried by the carrier. The origin of this approach resides mainly in the consideration of FM amplitude modulated signals. Here, the bandwidth of the signal is absolutely limited to twice the highest frequency carried by the carrier. As noted above, in the case of FM transmissions, the particular magnitude of the limitations is largely dependent upon the amplitude of the modulation index $\beta$. Increased modulation index results in multiplying the narrowband bandwith of the signal which is substantially equal to twice the highest frequency carried by the carrier by a number n corresponding to the number of significant sidebands. As the modulation index $\beta$ and the number of sidebands are increased, the result is a signal which has significant redundancy and, accordingly, as compared to AM, also has significant immunity to noise in the environment where the signal is being received.

As compared to AM, where the signal-to-noise ratio of the input radio frequency signal equals the signal to noise ratio of the demodulated signal, assuming the perfect demodulator, demodulated FM signals with high modulation indices have significantly higher signal-to-noise ratios compared to the input radio frequency FM signal. The gain of signal-to-noise ratio increases as the $\beta$ of the signal increases. Likewise, the number of significant sidebands also increases from one pair of sidebands where, for example, $\beta$ equals 0.2. A number of significant sidebands may be calculated by reference to the Bessel functions. For example, in the case of $\beta = 0.2$, the zero order Bessel function has a value of 0.99 and the first order function has a value of 0.1. On the other hand, if we increase the $\beta$ of the signal to 2.0, we find that the zero order Bessel function has an amplitude of 0.22, the first order Bessel function has an amplitude of 0.58, the second order Bessel function has an amplitude of 0.35, the third order Bessel function has an amplitude of 0.13, and the fourth order Bessel function has an amplitude of 0.03, telling us that there are four significant pairs of sidebands.

If we go back to the consideration of bandwidth as a function of the highest frequency being modulated, the existence of four significant sidebands, at modulation index $\beta = 2.0$, we see that the bandwidth of the signal will be equal to eight times the highest modulating frequency or four times the bandwidth of a similar AM signal.

When we consider that the Federal Communications Commission has set a maximum bandwidth of about 150 kilohertz for an FM signal and take into account that 15 kilohertz is the highest audio frequency typically transmitted by a commercial FM station, it can be seen that a maximum $\beta$ of four can be tolerated for such relatively high frequencies.

On the other hand, if we consider the possibility of filtering the signal to be transmitted, and consider that most of the energy is at the lowest frequencies, significantly higher modulation indexes can be tolerated for these frequencies while still retaining high fidelity in the transmitted signal.

In the case of stereo transmission, this problem is somewhat more complicated, but the same principles are applied. More particularly, in the place of stereo transmission, the signal which is impressed by frequency modulation onto the FM carrier in the FM broadcast band is the composite of an audio signal varying between 50 and 15,000 kHz, a 19 kilohertz pilot and a double sideband suppressed carrier signal centered at 38 kilohertz and extending between approximately 23 kilohertz and 53 kilohertz. The first audio signal ranging from 50 to 15,000 kilohertz is comprised of the sum of the left and right channels and, in the case of a simple FM receiver, is the only signal which is detected. This may be referred to as the baseband signal. The second, double sideband signal, ranging from 23 to 52 kilohertz is effectively an AM double sideband signal with a suppressed carrier of 38 kilohertz and comprises the difference between the left and right signals. This may be referred to as the stereo information signal.

Typically, the stereo information signal is generated using the 19 kilohertz pilot as the synchronization source for demodulation. The left channel signal is obtained by adding the composite signal to the stereo information signal, and the right channel is obtained by subtracting the stereo information signal from the composite signal.

As can be seen from the above, the successful operation of the system depends upon a relatively flat, wide band filter system for receiving the composite signal and the stereo information signal. Typically, this is done by using a tuning circuit which comprises a plurality of tuning networks whose peaks are staggered in order to synthesize a flat response across the bandpass with relatively sharp skirts. This approach is substantially the equivalent of similar filtering techniques used in AM broadcast reception in order to pass relatively narrow band signals while excluding adjacent stations.

While initially it would appear that the above signal would substantially fill the information carrying capability of the broadcast FM signal, in point of fact, even higher frequency signals may be carried by the FM carrier without interfering with operation of the standard FM broadcast receiver. In particular, this is typically done by adding two possible additional signals. The first of these is an FM signal having a carrier of 67 kilohertz and a bandwith of approximately 6 kilohertz. This narrow bandwidth signal is referred to as a subcarrier transmission and the demodulated output is sometimes called an SCA signal.

A second narrow band FM signal may also be transmitted at a subcarrier frequency of 92 kilohertz and also with a bandwidth of approximately 6 kilohertz.

In accordance with the prior art, reception of the subcarrier FM signals demands good filtering of these signals from each other and from adjacent composite and stereo information signals. This is done in the conventional manner using a cascade of tuned ferrite transformers, each of which is tuned in such a manner as to create effective rejection of signals outside the passband and a relatively flat response within the passband.

In particular, tuning is provided in prior art systems using a plurality of tuned transformers comprising a variable inductance and a fixed capacitance with the transformers being coupled to each other via relatively large coupling capacitors which couple the output of one transformer to the other for further filtering.

However, these tuned ferrite transformers are relatively expensive items and the necessity of having four to receive one subcarrier channel and eight to receive two subcarrier channels represents a significant part of the cost of an FM subcarrier receiver.

SUMMARY OF THE INVENTION

The invention, as claimed, is intended to provide a remedy. It solves a problem of how to extract a subcarrier signal from a demodulated FM broadcast signal without the need for a plurality of tuned ferrite transformers. Instead of the four tuned ferrite transformers, selective passing of a subcarrier signal is achieved through the use of a pair of two inexpensive simple inductances which are coupled to each other in such a manner as to enhance selectivity of the circuit, maintain DC voltage isolation, add the tuned characteristics of both individual circuits and avoid any substantial detuning of one circuit as a result of the operation of the other.

The FM subcarrier receiver is of the type useful for detection of a relatively high frequency subcarrier signal transmitted on an FM carrier which includes baseband and relatively high frequency signals. It comprises radio frequency circuitry for providing a radio frequency signal having frequency modulated baseband and subcarrier components. High pass filter circuitry receives the output of the radio frequency circuitry. A tuned circuit receives the output of the high pass filter. It comprises a first inductor and a first capacitor tuned substantially to the frequency of the subcarrier which one wishes to detect. A second tuned circuit is tuned to the subcarrier which one wishes to detect. The second tuned circuit comprises a second inductor and a second capacitor. The first and second inductors comprise ferrite cores and are positioned with respect to each other to allow magnetic coupling therebetween. A subcarrier demodulator coupled to the second inductor and the second capacitors provides an audio signal corresponding to the information carried by the subcarrier.

BRIEF DESCRIPTION OF THE DRAWINGS

One way of carrying out the invention is described in detail below with reference to drawings which illustrate only one specific embodiment of the invention and in which.

BEST MODE FOR CARRYING OUT THE INVENTION

Figure 1:
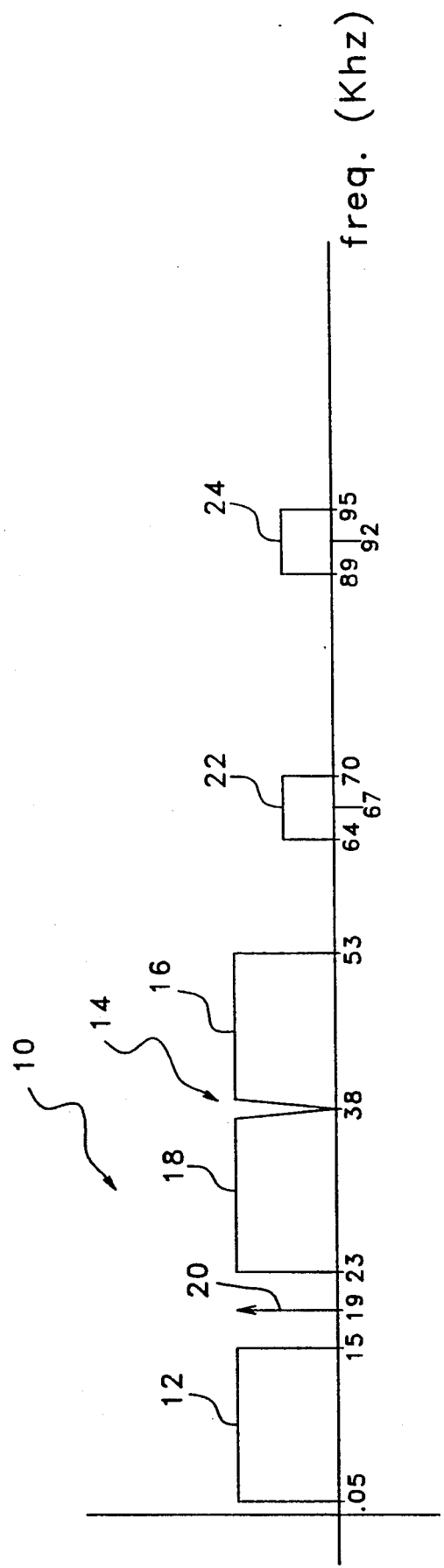
FIG. 1 is a diagram of an FM stereo signal.

Referring to FIG. 1, the diagram of the modulation information which is typically modulated onto an FM carrier is illustrated. Generally, the modulating signal 10 comprises a composite signal 12. Composite signal 12 is generally comprised of the addition of both the right and left channels of a stereo signal and has an energy distribution typically between 50 and 15,000 Hertz depending upon the frequency content of the particular signal being transmitted. For purposes of illustration, the signal is illustrated as having uniform frequency content throughout its entire range. However, it is to be understood that actual frequency content will vary significantly from signal to signal. For example, in the case of audio transmissions of the human voice, energy will be concentrated in the range between 300 and 3,000 Hertz. In the case of music, significant energy will be found in the range of 10-15 kilohertz. If, for example, a high frequency musical instrument, such as a violin is having its sound transmitted, most of the energy may reside in the 10-15 kilohertz range.

The signal also includes a stereo information signal 14, which has an amplitude equal to the amplitude of the left channel signal minus the amplitude of the right channel signal. Signal 14 is in the form of a double sideband suppressed carrier signal. In order to demodulate the information from signal 14, which includes an upper sideband signal 16 and a lower sideband signal 18, it is necessary to mix this signal with a carrier having a frequency of 38 kilohertz. Such a signal can be derived from a pilot signal 20 by means of a frequency doubler.

Finally, as discussed above, the modulating signal also includes a first subcarrier FM signal 22 which is an FM signal having a carrier at 67 kilohertz, and a second subcarrier signal 24 which is also an FM signal but having a subcarrier signal of 92 kilohertz.

As alluded to above, both of these signals must be transmitted at significantly lower modulation indices. This results in their having significantly lower energy levels, thus complicating the problem of separating these signals from the relatively high amplitude information contained in audio signal 12 and double sideband suppressed carrier signal 14.

Figure 2:
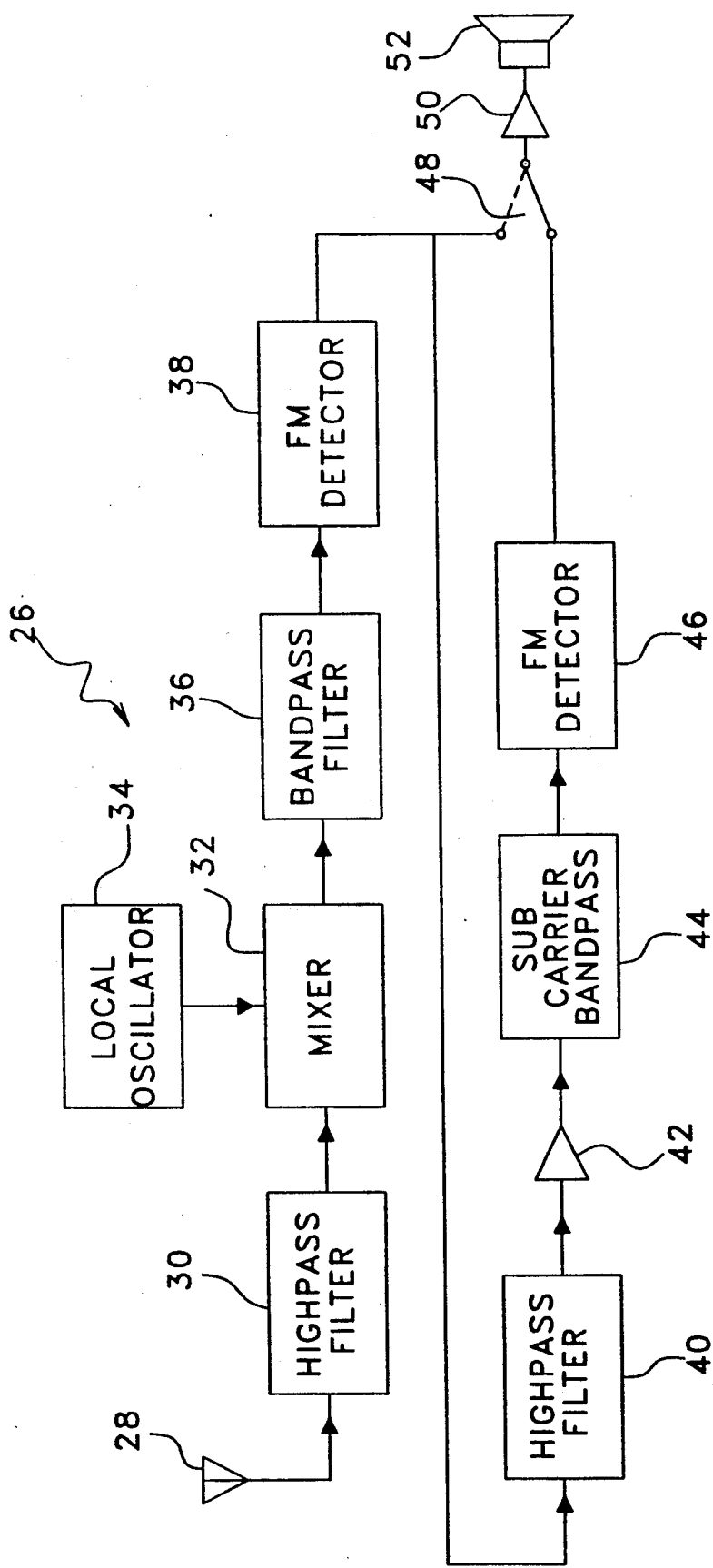
FIG. 2 is a block diagram of the inventive system.

Referring to FIG. 2, an FM radio receiver 26 is illustrated. Receiver 26 comprises an antenna 28 which couples its output to a high pass filter 30. High pass filter 30 is, in turn, coupled via its output to a mixer 32 which also receives the output of a local oscillator 34 to provide a heterodyne output at 10.7 Megahertz, which serves as the intermediate frequency for the receiver.

This 10.7 Megahertz output is, in turn, coupled to a bandpass filter 36 from whence it is coupled to an FM detector 38 which produces at its output the signal illustrated in FIG. 1. Initial filtering is provided by a high pass filter 40 which, in turn, has its output sent to an appropriate amplifier 42, in the case of a typical receiver. The output of amplifier 42, is coupled to a subcarrier bandpass filter 44 which, because of the relatively great amount of energy in composite and stereo information signals 12 and 14 must have significant attenuation in the range below 53 kilohertz, despite the action of bypass filter 40.

Ideally, the output of filter 44 contains only signal 22 or signal 24 which is then passed to an FM detector 46 from whence it may be coupled by via a switch 48 to an amplifier 50 which, in turn, provides an output to a speaker 52 which enables one to hear the decoded subcarrier signal. As a practical matter, it is noted that switch 48 may be put in the position illustrated in phantom lines in FIG. 2 to directly receive the output of the FM detector, and because of its frequency response, amplify only composite signal 12 for audible reproduction by speaker 52.

Figure 3:
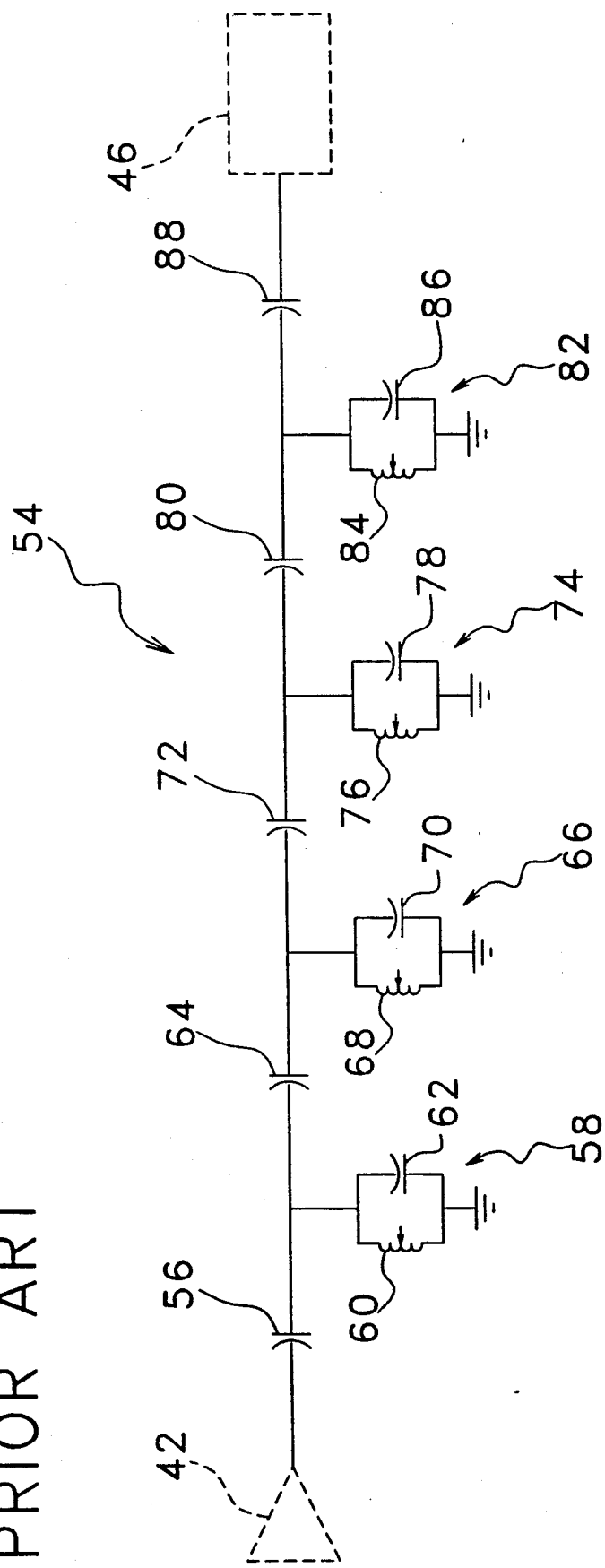
FIG. 3 is a schematic diagram of a prior art circuit.

As can be seen from FIG. 1, the primary problem involved in the reception of a subcarrier signal, such as signal 22 is the passing of that signal without the passing of the upper range of double sideband signal 14. It is noted that only 11 kilohertz of spectrum separates this signal from the double sideband signal. On the other hand, signal 22 is separated from signal 24 by 19 kilohertz. In order to achieve this type of selectivity, typically a network 54 such as that illustrated in FIG. 3 is required. Network 54 is a prior art circuit and comprises an input coupling capacitor 56 which couples the output of amplifier 42 to a tuned circuit 58 which comprises a tunable conductance 60 and a fixed capacitance 62. The output of this parallel tuned circuit is, in turn, coupled via a coupling capacitor 64 to a second tuned circuit 66 which comprises tunable inductance 68 and capacitance 70. The output of tuned circuit 66 is, in turn, coupled a coupling capacitance 72 to a third tuned circuit 74 comprising variable inductance 76 and capacitance 78. Finally, the output of tuned circuit 74 is coupled by a coupling capacitance 80 to a fourth tuned circuit 82 which, like the other circuits, comprises a variable inductance 84 and a fixed capacitance 86. The output of this circuit is, in turn, coupled to FM detector 46 by a coupling capacitor 88.

Figure 4:
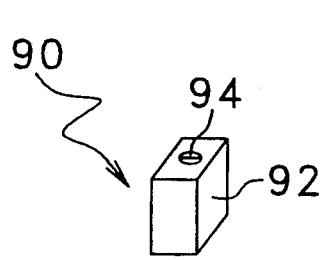
FIG. 4 is an illustration of a component of FIG. 3.

As discussed above, the cascaded circuit comprising tuned circuits 58, 66, 74 and 82 is effective in providing the degree of rejection of unwanted signals to allow effective receipt of subcarrier signals. Tuned circuits such as circuit 58 typically take the form of the device illustrated in FIG. 4, namely a shielded can type tuned circuit 90 comprising an outer shield or cam 92 and containing a tunable inductor with a ferrite core which may be tuned by rotation of the inductor within a threaded mounting via a screw slot 94.

Figure 5:
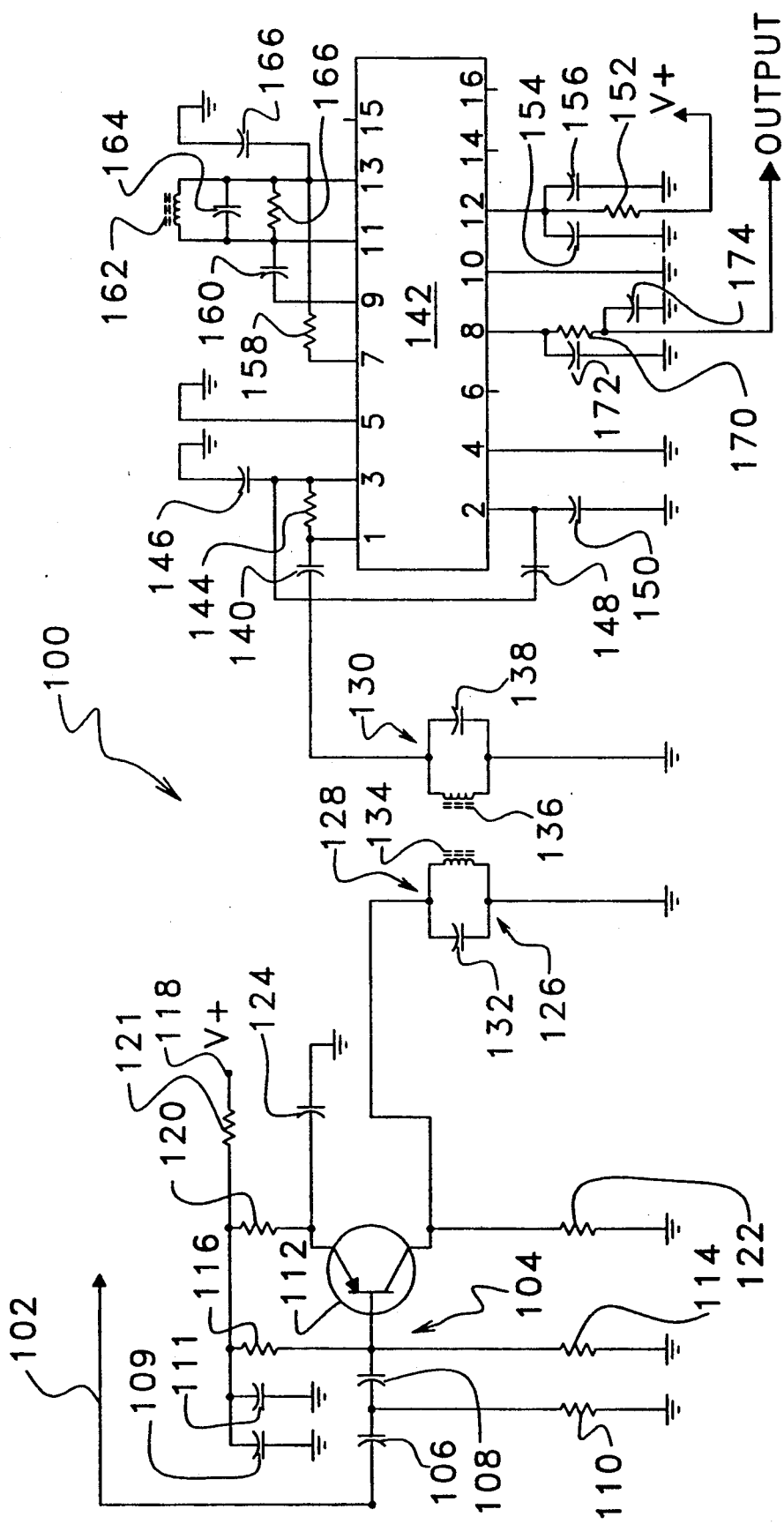
FIG. 5 is a schematic diagram of the inventive system.

Referring to FIG. 5, a subcarrier bandpass filter constructed in accordance with the present invention is illustrated. This circuit takes the output of a conventional FM detector or modulator, such as detector 38 and outputs a demodulated subcarrier signal. The input signal is received along line 102 which couples the input signal to a filter circuit 104, constructed in accordance with the present invention.

Generally, filter circuit 104 comprises 680 picofared capacitors 106 and 108 which are coupled to ground by a resistor 110 having a value of 4.7 kilohms to form a high pass R-C filter network whose output is coupled to PNP transistor 112. Biasing is provided for transistor 112 by resistors 114 and 116 which each have a value of 100 kilohms. Resistor 116 is connected at one end to the base of transistor 112 and at the other end to a source of positive potential at point 118 which serves as a power supply for the system.

The output load circuit of transistor 112 is provided with a pair of resistors 120 and 122, each of which has a value of 5.6 kilohms. The A.C. load line of the circuit is controlled by 470 picofared capacitor 124 which acts to bypass relatively high frequency A.C. signals.

The output of transistor 112 is coupled via its collector electrode to a tuned circuit 126 which comprises a pair of tuned inductors in free space. More particularly, tuned circuits 126 comprise a tuned transmitter section 128 and a tuned receiver section 130. Tuned transmitter section 128 comprises a capacitor 132 having a value of 3,000 picofareds and an inductance 134 having a value of one millihenry. Tuned circuit 130 comprises an inductance 136 having a value of one millihenry in parallel with a capacitance 138, having a value of 3,000 picofareds.

Power is coupled from point 118 to transistor 112 via resistor 120 and resistor 121, which has a value of 470 ohms.

It is noted that capacitors 132 and 138 are selected to cause circuits 128 and 130 to resonate at 92 kilohertz.

The output of tuned circuit 130 is coupled via a capacitor 140, having a value of 0.1 microfareds to a demodulator 142 which, by way of example, may be an integrated circuit of the type sold by Samsung Electronics under Catalogue Number K A 22441. Integrated circuit 142 has a number of pins which are coupled to the various components illustrated in order to function as an effective demodulator. In particular, pin one serves as an input and a resistor 144, having a value of 4.7 kilohms coupled between pins one and three. A capacitor 146, having a value of 0.1 microfareds is coupled between pin 3 and ground. Capacitor 148, having a value of 0.1 microfareds is coupled between pins 3 and 2. Another capacitor 150 is coupled between pin 2 and ground and has a value of 0.1 microfareds. Pins 4 and 5 are grounded and power is coupled via resistor 152, which has a value of 10 ohms, to pin 12. 0.1 microfared capacitor 154 and 47,000 picofared capacitor 156 are coupled to ground. 4.7 kilohm resistor 158 is coupled between pins 7 and 13. 470 picofared capacitor 160 is coupled between pins 9 and 11 and a tuned circuit comprising a fifteen millihenry inductor 162 and a 222 picofared capacitor 164 connected in parallel between pins 11 and 13. The selectivity of this tuned circuit is reduced by resistor 166 which is connected in parallel with inductor 162 and capacitor 164. AC bypass is provided by a capacitor 166 connected between pin 13 and ground.

The output of integrated circuit demodulator 142 is provided via pin 8 to an output coupling network comprising a ten kilohm resistor 170 and a pair of capacitors 172 and 174, both of which have values of 223 picofareds and are connected between opposite ends of resistor 170 to form a low-pass filter.

In accordance with the preferred embodiment position, a 0.1 microfared capacitor 109 and 47 microfared capacitor 101 are provided.

In accordance with the preferred embodiment, capacitors 111, and 156 are so-called Mylar (R) capacitors. The remaining capacitors may be either electrolytic or ceramic.

Figure 7:
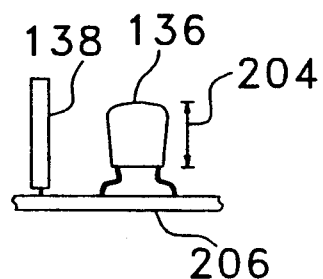
FIG. 7 is a view along lines 7—7 of FIG. 6.
Figure 6:
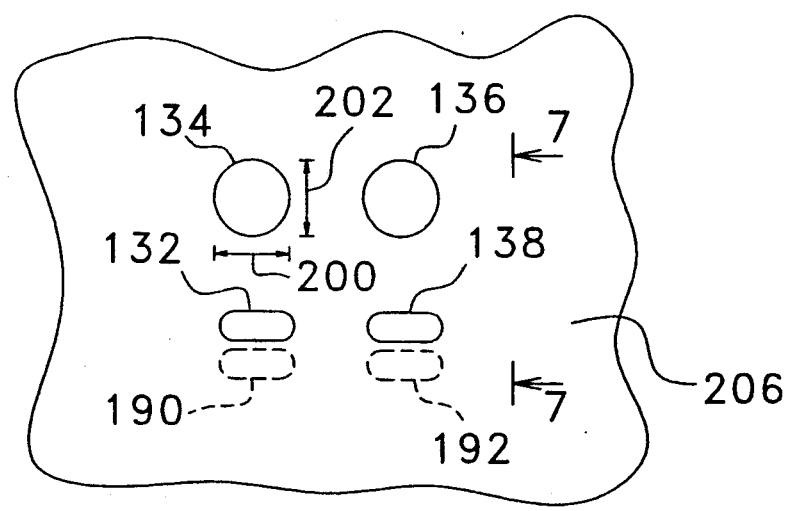
FIG. 6 is a view of part of the circuit of FIG. 5.

The construction of tuned circuits 126 and 130 is illustrated in FIG. 6. In particular, inductance 134 is seen to comprise a 1 millihenry ferrite inductor having dimensions generally on the order of 0.4 centimeters in width 200 and a length 202 on the order of 0.5 centimeters. The height 204 of this inductor is on the order of 0.6 centimeters. Inductor 136 has the same dimensions as 134. As shown in FIG. 7, capacitors 132 and 138 are mounted adjacent the inductors on a board 206.

It is noted that the component values given above are for the preferred embodiment of a circuit constructed in accordance with the present invention and operating to detect the 92 kilohertz subcarrier. In the event that one desires to construct a circuit to detect a 67 kilohertz subcarrier, capacitors 132 and 138 would be replaced by capacitors 190 and 192 which would have a value of about 5600 picofareds. Likewise, capacitor 164 would be replaced by a capacitor having a value of about 100 picofareds.

During operation, input FM signals in the 88–108 megahertz range are received by antenna 28 which passes them to high pass filter 30. The output of filter 30 is multiplied by the output of local oscillator 34 to yield a 10.7 megahertz products for the particular FM station being received. This intermediate frequency 10.7 megahertz signal is selected out by bandpass filter 36 which sends it to an FM detector 38 which outputs the signal illustrated in FIG. 1.

This signal is received by the amplifier comprising transistor 112 which acts as a high pass filter and provides the particular portion of the spectrum containing the subcarrier signals to a tuned tank circuit 128, as illustrated in FIG. 5. The two subcarrier signals are provided to tuned circuit 126 which, because of its tuned properties, induces primarily one of the subcarrier signals into inductor 136 by virtue of inductive coupling between inductor 134 and inductor 136.

Inductors 134 and 136 are positioned about 0.6 centimeters from each other and are both mounted on their wire leads 208. A range of 0.4 to 0.8 centimeters in this position will vary coupling to the ideal. In particular, the amount of inductive coupling between inductors 134 and 136 may be varied by bending them on their wire leads 208 which also serve as support members toward and away from each other until good reception is achieved.

Inductors 134 and 136 are substantially identical, being of the type available under Catalogue Number EL0606SKI-102K from TDK Corporation of America of Skokie, Ill., U.S.A. or under Catalogue Number 7PAI.0mH from Toko America, Inc. of Mount Prospect, Ill. Generally, these inductors comprise a ferrite core with windings of copper wire wound around them.

As a consequence of the above filtering provided by the combination of the R-C network at the base of transistor 112 and transmitter and receiver sections 128 and 130, substantially only one of the subcarrier signals is passed to integrated circuit demodulator 142 by capacitor 140. As noted above, the main problem is the filtering of the relatively high amount of energy in signals 12 and 14. This begins to be accomplished by the above R-C network and the particular characteristics of tuned circuits 128 and 130. These circuits are particularly efficient in doing this job insofar as they are not coupled to each other electrically but only through magnetic fields and are spatially separated from each other. Such spatial separation is of particular value in view of the fact that the high energy undesired primary FM signal components are relatively low in frequency and thus will experience a very sharp cut off because of the nature of coupling between inductances 134 and 136.

Relatively low frequency signals in the range below 55 kilohertz, depending upon the spacing between inductances 134 and 136 will not be transmitted by magnetic field coupling. At the same time, the high selectivity of tuned circuits 128 and 130 will not be compromised by coupling to other circuits due to the high impedance of the output of transistor 112, the input of integrated circuit 142 and the impedance seen by inductor 134 looking forwardly and the impedance seen by inductor 136 looking toward the input to the circuit.

While an illustrative embodiment of the invention has been described above, it is, of course, understood that various modifications will be apparent to those of ordinary skill in the art. Such modifications are within the spirit and scope of the invention, which is limited and defined only by the appended claims.

What is claimed is:

1. An FM subcarrier receiver of the type useful for detection of a relatively high frequency desired subcarrier signal transmitted on an FM carrier which includes a baseband signal and said relatively high frequency subcarrier signal, comprising:
   (a) radio frequency means for receiving a radio frequency signal having frequency modulated baseband and subcarrier components and outputting said baseband and relatively high frequency subcarrier signals;
   (b) a high pass filter for receiving the output of said radio frequency means;
   (c) a tuned circuit for receiving the output of said high pass filter, said tuned circuit comprising a first inductor of fixed inductance and a first capacitor tuned substantially to the frequency of the subcarrier which one wishes to detect;
   (d) a second tuned circuit tuned to said subcarrier which one wishes to detect, said second tuned circuit comprising a second inductor of fixed inductance and a second capacitor, said first and second inductors comprising ferrite cores and adjustably positioned with respect to each other to allow magnetic coupling therebetween; and
   (e) a subcarrier demodulator coupled to said second inductor and said second capacitor for providing an audio signal corresponding to the information carried by said desired subcarrier.

2. An FM subcarrier receiver as in claim 1, wherein said first and second inductors are positioned adjacent to each other at a distance of between 0.4 and 0.8 centimeters.

3. An FM subcarrier receiver as in claim 2, wherein first and second inductors are mounted on wires which may be bent to displace said first and second inductors toward or away from each other to allow tuning.

4. An FM subcarrier receiver as in claim 1, wherein said high pass filter circuit comprises a plurality of capacitors in series and a plurality of resistors connected between said capacitors and a constant potential.

5. An FM subcarrier receiver as in claim 3, wherein said high pass filter circuit comprises a plurality of capacitors in series and a plurality of resistors connected between said capacitors and a constant potential.

6. An FM subcarrier receiver as in claim 1, wherein first and second inductors are mounted on wires which may be bent to displace said first and second inductors toward or away from each other to allow tuning.

7. An FM subcarrier receiver of the type useful for detection of a relatively high frequency subcarrier signal transmitted on an FM carrier, said carrier being modulated with a primary signal comprising a pair of high fidelity audio signals, said pair of signals including a composite audio signal and a stereo audio signal, and said relatively high frequency subcarrier signal having a bandwidth and power less than said primary signal, comprising:
   (a) a frequency modulation radio receiver for receiving said modulated FM carrier and outputting said composite signal, said stereo signal and said relatively high frequency subcarrier signal;
   (b) a first tuned circuit for receiving the output of said radio receiver, said first tuned circuit comprising a first single inductor and a first capacitor tuned at a frequency less than 100 kHz and tuned substantially to the frequency of said relatively high frequency subcarrier signal which one wishes to detect;
   (c) a second tuned circuit tuned at a frequency less than 100 kHz and substantially tuned to said relatively high frequency subcarrier signal, said second tuned circuit comprising a second single inductor and a second capacitor, said first and second inductors comprising ferrite cores and adjustably positioned with respect to each other to allow magnetic air coupling therebetween, said air coupling being substantially the sole coupling between said first and second tuned circuits;
   (d) first and second support structures for supporting said first and second inductors; and
   (e) a subcarrier demodulator coupled to said second inductor and said second capacitor for providing a third audio signal corresponding to information carried by said relatively high frequency subcarrier signal.

8. An FM subcarrier receiver as in claim 7, wherein said radio receiver is coupled to said first tuned circuit by a high pass filter comprising a plurality of capacitors in series and a plurality of resistors connected between said capacitors and a constant potential.

9. An FM subcarrier receiver as in claim 7, wherein said first inductor and said first capacitor are connected in parallel, and said second inductor and said second capacitor are connected in parallel.

10. An FM subcarrier receiver as in claim 7, wherein said first and second inductors are positioned adjacent to each other at a distance of between 0.4 and 0.8 centimeters.

11. An FM subcarrier receiver as in claim 7, wherein first and second inductors are mounted on wires which may be bent to displace said first and second inductors toward or away from each other.

12. An FM subcarrier receiver as in claim 7, wherein the first and second inductors have a fixed value of inductance.

13. An FM subcarrier receiver as in claim 12, wherein said first and second inductors are positioned adjacent to each other at a distance of between 0.4 and 0.8 centimeters.

14. An FM subcarrier receiver as in claim 13, wherein first and second inductors are mounted on wires which may be bent to displace said first and second inductors toward or away from each other.

15. An FM subcarrier receiver as in claim 14, wherein said radio receiver is coupled to said first tuned circuit by a high pass filter comprising a plurality of capacitors in series and a plurality of resistors connected between said capacitors and a constant potential.

16. An FM subcarrier receiver as in claim 15, wherein said first inductor and said first capacitor are connected in parallel, and said second inductor and said second capacitor are connected in parallel.

* * * * *